United States Patent
Qualich et al.

[11] Patent Number: 5,949,121
[45] Date of Patent: *Sep. 7, 1999

[54] TEMPERATURE-INDICATING FIELD EFFECT TRANSISTOR

[75] Inventors: John R. Qualich, Buffalo Grove, Ill.; Charles J. Walker, Trevor, Wis.

[73] Assignee: Motorola Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/691,720

[22] Filed: Aug. 2, 1996

[51] Int. Cl.⁶ .................................................. H01L 31/06

[52] U.S. Cl. ........................... 257/467; 257/468; 257/470; 257/723

[58] Field of Search ..................... 257/467, 468, 257/470, 723, 724; 374/178

[56] References Cited

U.S. PATENT DOCUMENTS

| | | | |
|---|---|---|---|
| 4,896,199 | 1/1990 | Tsuzuki et al. | 357/28 |
| 5,025,298 | 6/1991 | Fay et al. | 357/41 |

*Primary Examiner*—Sara Crane
*Attorney, Agent, or Firm*—Nicholas C. Hopman

[57] ABSTRACT

A temperature-indicating field effect transistor (100) includes a transistor die (101) including a drain (103), a source (105), and a gate (107). A temperature measurement device (109, 111) is thermally coupled to the transistor die (101) and electrically coupled to the gate (107). A transistor package (113) encapsulates the transistor die (101) and the temperature measurement device (109, 111). The transistor package (113) has three externally accessible terminals including a first terminal (115) connected to the drain (103), a second terminal (117) connected to the source (105), and an input terminal (119) coupled to the temperature measurement device (109, 111).

8 Claims, 1 Drawing Sheet

5,949,121

TEMPERATURE-INDICATING FIELD EFFECT TRANSISTOR

FIELD OF THE INVENTION

This invention is related to the field of semiconductors and more particularly to temperature-indicating field effect transistors.

BACKGROUND OF THE INVENTION

Electronic systems often need to drive load devices. Transistor based load drivers that drive these loads must be optimized to provide maximum drive capability while offering driver protection in case of an open or short circuit while operating over a wide thermal envelope. Many driver failures are thermally caused—that is by operating a driver's transistor at too high of a temperature. Some drivers use electrical sensing to extrapolate an operating temperature of the driver's transistor. In this scheme when the sensed signal exceeds a predetermined limit, the driver's transistor is shut down or the drive is cut back to the driver's transistor to abort the rise in temperature that would ultimately have destroyed the driver's transistor. One problem with this approach is that since an electrical signal is used to estimate the driver transistor's operating temperature based on an apriori model, it is necessarily inaccurate to allow for physical differences from transistor to transistor. Because of the use of an apriori model, and the physical differences from transistor to transistor, the driver can not be optimized to provide maximum drive for every transistor driver. Another problem with this approach is that the sensing circuitry often adds a power consumptive component in the load circuit. This causes undue heating in the power consumptive component but is necessary to derive the electrical signal used to estimate the driver transistor's operating temperature.

Another design challenge in the design of contemporary load drivers is the maximization of packaging density—said another way, the minimization of physical size of the driver. Other prior art schemes use a separate component, such as a thermistor that is physically coupled to the driver's transistor to more accurately estimate the temperature of the driver. The driver's transistor is then regulated dependent on the temperature estimation. This approach inherently requires additional components—which adds to the driver's size and complexity. Also, this temperature-measurement approach is error prone because of the nature of the physical coupling between the thermistor and the driver's transistor. Both static and dynamic thermal gradients will result from this physical coupling—resulting in less-than-optimal drive of the driver's transistor. Also, because a separate temperature sensing element is used additional electrical connections must be made—which forces the driver's transistor to be packaged in a non-standard package, adding cost and manufacturing complexity. Typically, a five-pin package is needed rather than a standard three-pin transistor package.

In other cases, a thermal turn-off circuit is located within a 3-pin transistor package. The disadvantage of this approach is that the circuit driving the transistor package does not receive any temperature information about the transistor's die, nor does the driving circuit have control of the turn-off temperature of the transistor.

What is needed is an improved device for driving loads that is less complex, more physically compact, easier to manufacture, and fits into a standard package.

DETAILED DESCRIPTION OF A PREFERRED EMBODIMENT

A temperature-indicating field effect transistor includes a transistor die with a drain, a source, and a gate. A temperature measurement device is thermally coupled to the transistor die and electrically coupled to the gate. A transistor package encapsulates the transistor die and the temperature measurement device. The transistor package has three externally accessible terminals including a first terminal connected to the drain, a second terminal connected to the source, and an input terminal coupled to the temperature measurement device.

Figure 1:
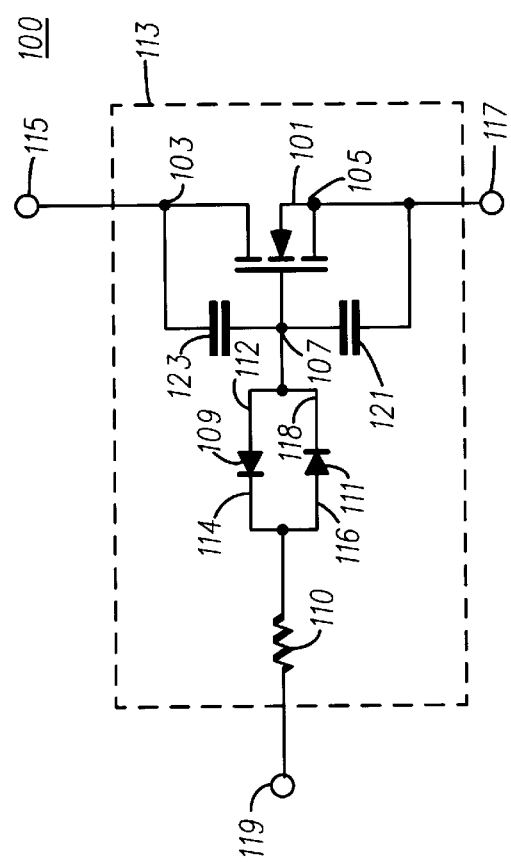
FIG. 1 is a schematic drawing of a temperature-indicating field effect transistor in accordance with a preferred embodiment of the invention.

FIG. 1 is a schematic drawing of a temperature-indicating field effect transistor in accordance with a preferred embodiment of the invention.

The temperature-indicating field effect transistor 100 includes an N-channel MOSFET transistor die 101 with a drain 103, a source 105, and a gate 107. A temperature measurement device, preferably comprised of parallel coupled diodes, (arranged in a back-to-back electrical configuration) is integrated into the transistor die 101 (to ensure tight thermal coupling) and electrically coupled to the gate 107. The parallel coupled diodes include a first diode 109 with anode 112 and cathode terminals 114, and a second diode 111 having an anode 116 terminal coupled to the cathode terminal 114 of the first diode 109, and a cathode terminal 118 coupled to the anode terminal 112 of the first diode 109.

A transistor package 113, preferably a conventional transistor style package, encapsulates the transistor die 101 and the temperature measurement device 109, 111. The transistor package 113 has three externally accessible terminals including a first terminal 115 connected to the drain 103, a second terminal 117 connected to the source 105, and an input terminal 119 coupled to the temperature measurement device 109, 111. In some applications different coupling structures may be useful. For instance, a resistor 110 could be embedded within the three pin package connected in series with the input terminal 119, the parallel coupled diodes 109 and 111, and the gate 107 of the transistor die 101. This resistor 110 can be used to limit current in the transistor's input circuit.

The transistor die 101 also has inherent capacitors 121 and 123 as part of its structure. Typically, in a relatively large power-type transistor these capacitors can be up to about 5,500 picofarads in size. The relatively large size of these capacitors is important to consider when designing the transistor die 101 into a system as shown in FIG. 2.

Figure 2:
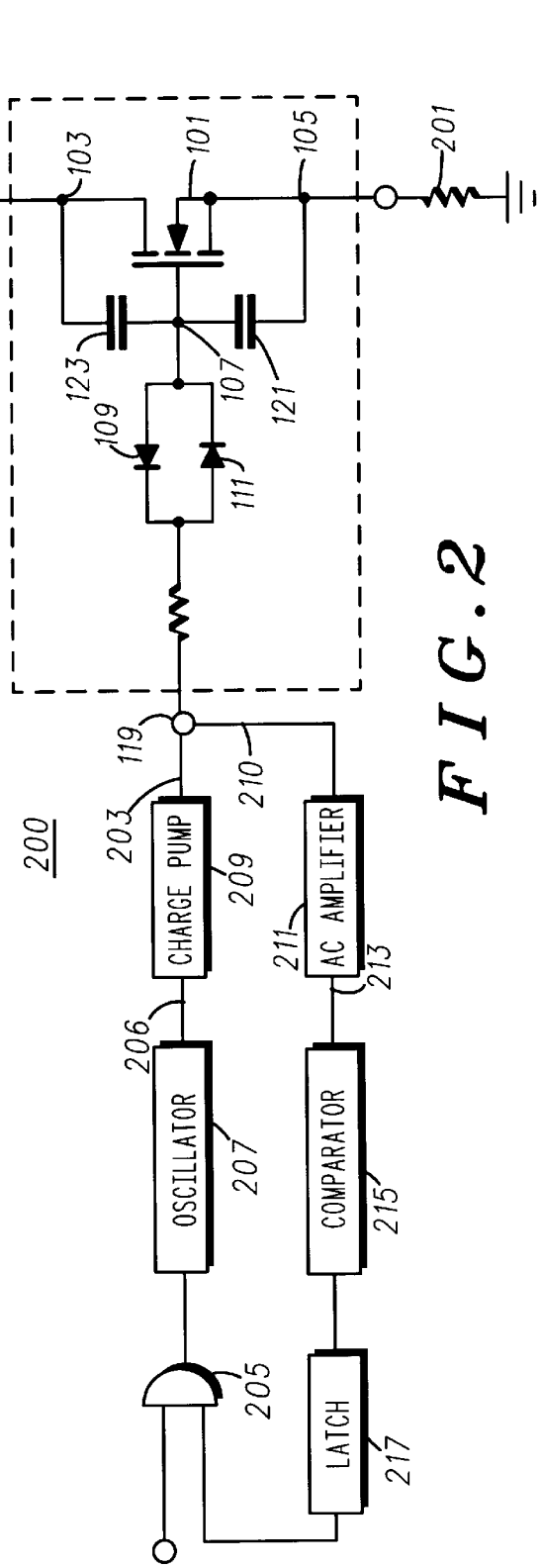
FIG. 2 is a schematic block diagram illustrating a driver circuit in accordance with a preferred embodiment of the invention.

FIG. 2 is a schematic block diagram illustrating a driver circuit in accordance with another embodiment of the invention. A driver circuit 200 includes a charge pump 209 for deriving the appropriate drive signal to drive the transistor. The transistor 100 is connected between a power supply 202 and a load 201. The charge pump 209 is essentially a boost circuit which creates a drive signal 203 in the form of a voltage at the gate 107 that is higher than that of the drain 103. The charge pump 209 does this by repetitively alternating between forcing a small current into the control terminal 119 and not forcing any current into the control terminal 119. The current forced into the control terminal 119 charges capacitors 121 and 123, resulting in a high voltage at the gate 107. Typically, the voltage at the gate 107 will operate at a potential 10 volts higher than the voltage at the drain 103. Because the capacitors 121 and 123 are large, the small amount of current provided by the charge pump 209 each cycle will not appreciably change the voltage at the gate 107. So the voltage at the gate 107 is essentially a steady DC value.

During the time the charge pump 209 is forcing current into the control terminal 119, diode 111 will be forward biased. During the time the charge pump 209 is not forcing current into the control terminal 119 a small current will flow from the gate 107 through diode 109 and into an AC amplifier 211. Diode 109 will be forward biased at that time. With the described configuration diode 109 and diode 111 will be alternately forward biased.

Since the voltage at the gate 107 is essentially a DC value, the voltage at the control terminal 119 will have an AC component equal to a sum of the forward biased voltages of diode 109 and diode 111. When diode 111 is forward biased, the voltage at the control terminal 119 will be greater than the voltage at the gate 107. When the diode 109 is forward biased, the voltage at the control terminal 119 will be smaller than the voltage at the gate 107.

Because the forward voltage of the diodes 109 and 111 has a temperature coefficient of about −2 millivolts per degree Celsius, an amplitude of the AC voltage at the control terminal 119 will vary proportionally with temperature—the amplitude will decrease as the transistor die 101 becomes hotter. Therefore, the amplitude of the AC component of the voltage at the control terminal 119 indicates the temperature of the transistor die 101.

This temperature indicating signal 210 present at the control terminal 119 is amplified and rectified by an AC amplifier 211 to produce a temperature varying signal 213 that varies with the temperature of the transistor die 101. The temperature varying signal 213 connects to a comparator 215 with a voltage threshold calibrated to ensure the comparator 215 changes state at a safe high level of temperature of the transistor die 101, for example 175 degrees Celsius. Should the comparator be tripped because the temperature of the transistor die 101 is too high, a latch 217 will change state, and inhibit operation of the oscillator 207 by way of a logical AND gate 205.

Note that the transistor die 101 will operate as a conventional transistor despite the diodes 109, 111 in the gate circuit. For example, current conduction is increased between the drain 103 and the source 105 responsive to a first state of the drive signal 203 (when the charge pump is gated on), and current conduction is reduced between the drain 103 and the source 105 responsive to a second state of the drive signal 203 (when the charge pump is gated off).

In conclusion, an improved device for driving loads that is less complex, more physically compact, easier to manufacture, and fits into a standard transistor three-terminal package has been detailed above. Since the temperature measurement device operates in the gate circuit of the transistor, only three connections are required to both control the transistor, and obtain temperature information.

What is claimed is:

1. A temperature-indicating field effect transistor controllable by a drive signal, the transistor comprising:

a transistor die having a drain, a source, and a gate;

a temperature measurement device thermally coupled to the transistor die and electrically coupled to the gate; and a transistor package encapsulating the transistor die and the temperature measurement device, the transistor package having three externally accessible terminals including a first terminal connected to the drain, a second terminal connected to the source, and an input terminal coupled to the temperature measurement device, wherein the temperature measurement device outputs a temperature indicating signal with an AC component, indicative of a temperature of the transistor die, to the input terminal responsive to the drive signal.

2. A transistor in accordance with claim 1 further comprising a resistor forming the electrical coupling between the input terminal and the temperature measurement device.

3. A temperature-indicating field effect transistor controllable by a drive signal, the transistor comprising:

an transistor package with three electrically-conductive terminals connected between an inside cavity to an outside surface;

a transistor die disposed encapsulated within the inside cavity of the transistor package, the transistor die having a drain terminal coupled to a first electrically-conductive terminal of the three electrically-conductive terminals, a source terminal coupled to a second electrically-conductive terminal of the three electrically-conductive terminals, and a gate terminal; and a temperature measurement device thermally coupled to the transistor die, and electrically coupled between the gate terminal and a third electrically-conductive terminal of the three electrically-conductive terminals, wherein the temperature measurement device outputs a temperature indicating signal with an AC component having an amplitude indicative of a temperature of the transistor die, to the third electrically-conductive terminal, responsive to the drive signal.

4. A transistor in accordance with claim 3 wherein the temperature measurement device comprises parallel coupled diodes.

5. A transistor in accordance with claim 4 wherein the wherein the parallel coupled diodes comprise:

a first diode with anode and cathode terminals; and a second diode having an anode terminal coupled to the cathode terminal of the first diode, and a cathode terminal coupled to the anode terminal of the first diode.

6. A transistor in accordance with claim 4 wherein responsive to the, current conduction is increased between the drain and the source responsive to a first state of the drive signal, and current conduction is reduced between the drain and the source responsive to a second state of the drive signal.

7. A transistor in accordance with claim 6 wherein the temperature measurement device outputs a temperature indicating signal, indicative of a temperature of the transistor die, to the third electrically-conductive terminal responsive to the drive signal.

8. A transistor in accordance with claim 3 further comprising a resistor forming the electrical coupling between the third electrically-conductive terminal of the three electrically-conductive terminals and the temperature measurement device.

* * * * *